United States Patent [19]

Narayan

[11] 4,281,034
[45] Jul. 28, 1981

[54] PLATING ON PLASTICS BY SOFTENING WITH TRICHLOROETHYLENE AND METHYLENE CHLORIDE BATH

[75] Inventor: Raichur S. Narayan, Schaumburg, Ill.

[73] Assignee: Sunbeam Corporation, Chicago, Ill.

[21] Appl. No.: 137,024

[22] Filed: Apr. 3, 1980

[51] Int. Cl.$^3$ ............................ C23C 3/00; C23C 7/00; C25D 5/56

[52] U.S. Cl. ............................ 427/191; 156/668; 204/30; 204/38 B; 427/192; 427/205; 427/306; 427/307; 427/331; 427/383.1; 427/430.1; 427/436; 427/422; 427/421

[58] Field of Search ............ 427/191, 192, 205, 306, 427/307, 331, 383.1, 430.1, 436, 421, 422; 204/30, 38 B; 156/668

[56] References Cited

U.S. PATENT DOCUMENTS

| | | |
|---|---|---|
| 3,466,229 | 9/1969 | Whitacre ............................ 427/307 |
| 3,524,754 | 8/1970 | Blytas ............................ 427/307 |
| 3,647,512 | 7/1970 | Grunwald . |
| 3,650,708 | 3/1970 | Gallagher . |
| 3,754,976 | 8/1973 | Babecki ............................ 427/205 |
| 4,078,097 | 3/1978 | Miller ............................ 427/422 |

OTHER PUBLICATIONS

Goldman, "Electroplating", *Modern Plastics Encyclopedia 1979-1980*, vol. 56, No. 10A, McGraw-Hill Inc. N.Y., Oct. 1979 pp. 436-437.
Himler et al., "Preparing Plastics for Plating" *SPE Journal*, vol. 29, Jun. 1973 pp. 57-60.
Stefanides, "Electroplated ABS Parts", *Design News*, Mar. 3, 1965.
"Electroplating the 'Unplatables'," *Modern Plastics*, Nov. 1967, pp. 98-101.
MacNeill et al., "Plated Plastic Parts", *Materials in Design Engineering*, Nov. 1962 pp. 122-125.
Pinkerton, "Preparing Nonconductors for Electroplating" Chapter 28 in F. A. Lowenheim, Editor, *Modern Electroplating*, 2nd Edition, ©1963, pp. 604-617.
Saubestre, "Plating on Nonconductors", Chapter 28 in F. A. Lowenheim, editor, *Modern Electroplating*, 3rd edition ©1974, pp. 636-655.
Narcus, *Metallizing of Plastics*, Reinhold Publishing Corporation N. Y. ©1960 pp. 148-159.
Blumentri; H. et al., "Coatings for Rigid Thermoplastic Substrates" IBM Technical Disclosure Bulletin, 13, No. 7, Dec. 1970.

*Primary Examiner*—John D. Smith
*Attorney, Agent, or Firm*—George R. Clark; Neil M. Rose; Allen J. Hoover

[57] ABSTRACT

An article fabricated from a resin (e.g. ABS, polycarbonates, polyethylenes, polyaryl ether, or polypropylene of platable grades) susceptible to softening when contacted with trichloroethylene or a mixture of trichloroethylene and methylene chloride is dipped into an alkaline detergent, rinsed, and immersed in an agitated bath (by volume, 90 parts of trichloroethylene, 9 to 10 parts of ethanol, and 0 to 1 part of methylene chloride—1 part of methylene chloride if the resin is polypropylene) to which copper or nickel has been added as a powder (50 to 150 microns, 200 to 250 grams per liter) whereupon the article is drained, dipped in an agitated bath of similar composition, and dried. Alternatively, the powder may be sprayed onto the article, after the article has been immersed in such a bath. Next, the article may be dipped in dilute nitric acid, rinsed and immersed in a non-catalytic bath for deposition of nickel.

20 Claims, No Drawings

PLATING ON PLASTICS BY SOFTENING WITH TRICHLOROETHYLENE AND METHYLENE CHLORIDE BATH

BACKGROUND OF THE INVENTION

This invention pertains to a process for plating a metal such as copper or nickel on an article fabricated from a platable resin, which may be any of a variety of resins including polypropylene as well as acrylonitrile-butadiene-styrene copolymers, polyaryl ethers, polycarbonates, polyethylene, and other resins in common engineering use.

Conventionally, an article molded of a platable grade of acrylonitrile-butadiene-styrene copolymer (ABS) or other resin is plated by one of various processes requiring the article to be cleaned, etched in a strong acid, and sensitized in an acidic solution of tin salts, palladium salts, or other compounds, which act as catalysts for subsequent deposition of a metal in a bath by immersion or by reduction of the metal from a complex. Commonly, the strong acid is chromic acid, either with or without sulfuric acid. Typical steps of such processes are given by H. M. Goldman, "Electroplating," *Modern Plastics Encyclopedia* 1979-1980, Volume 56, Number 10A, McGraw-Hill, Inc., New York, October 1979, at pages 436-437.

Other references of pertinent interest include: D. W. Himler and J. A. Alzapiedi, "Preparing Plastics for Plating," *SPE Journal*, Vol. 29, June 1973, at pages 57-60; E. J. Stefanides, "Electroplated ABS Parts," *Design News*, March 3, 1965; "Electroplating 'the unplatables,'" *Modern Plastics*, November 1967, at pages 98-101; C. E. MacNeill and G. T. Chiurazzi, "Plated Plastic Parts," *Materials in Design Engineering*, November 1962, at pages 122-125; H. L. Pinkerton, "Preparing Nonconductors for Electroplating," Chapter 28 in F. A. Lowenheim, Editor, *Modern Electroplating*, 2nd Edition, John Wiley & Sons, Inc., New York, copyright 1963, at pages 604-617; and E. B. Saubestre, "Plating on Nonconductors," Chapter 28 in F. A. Lowenheim, Editor, *Modern Electroplating*, 3rd Edition, John Wiley & Sons, Inc., New York, copyright 1974, at pages 636-655.

Various chemical and mechanical processes for metallizing of plastics are considered in H. Narcus, *Metallizing of Plastics*, Reinhold Publishing Corporation, New York, copyright 1960. As considered by H. Narcus, op. cit., at pages 148-159, such processes include spraying of heated metal particles in compressed air.

It is known that trichloroethylene softens (swells) many resins although not polypropylene, but use of trichloroethylene in plating on resins has been restricted. A process wherein an article is immersed successively in a solution containing trichloroethylene, ethanol, and phosphorous sesquisulfide, and in a solution of copper pyrophosphate so as to produce what is described as "a red conductive copper-phosphorus-sulfur coating", before the article is electroplated initially with nickel and subsequently with chrome, is disclosed in U.S. Pat. No. 3,650,708 to W. P. Gallagher. A process wherein an article is immersed in a bath containing trichloroethylene, white phosphorous, an anionic blend of alkaryl hydrotopes, and sodium dodecyl diphenyl ether disulfonate, is disclosed in U.S. Pat. No. 3,647,512 to J. J. Grunwald et al.

However, there remains a need, to which this invention is directed, for a process which is simple, fast, inexpensive, and effective for plating on a variety of plastics, which does not require chromic acid either with or without sulfuric acid, and which does not require initial deposition of a metal by catalytic reaction.

SUMMARY OF THE INVENTION

Pursuant to this invention, a metal can be plated on an article molded or fabricated otherwise from a resin susceptible to softening upon contact with trichloroethylene or with trichloroethylene and methylene chloride, by a process comprising the steps of immersing the article in a bath of specific composition, contacting the article with the metal as a powder of particle sizes of approximately from 50 to 150 microns, and dipping the article in a bath of similar composition. Preferably, the metal is copper, although nickel or some other metal may be used.

Pursuant to this invention, each bath is agitated as the article is immersed or dipped therein, and each bath consists essentially of approximately 90 parts of trichloroethylene by volume, approximately from 9 to 10 parts of ethanol by volume, and approximately from 0 to 1 part of methylene chloride by volume. Approximately 1 part of methylene chloride by volume is used if the selected resin is an epoxy resin or polypropylene. Preferably, each bath is maintained at a temperature of approximately from 20° to 30° C.

Preliminarily, the article may be dipped into an alkaline cleaner and rinsed in water, before the article is immersed for approximately from 20 to 30 seconds in a bath as mentioned above.

Preferably, the powder has been added, in an amount of approximately from 200 to 250 grams per liter of the bath, to the bath wherein the article is to be immersed initially, whereupon said bath is agitated for approximately from 15 to 25 seconds after the article has been immersed therein, whereupon agitation of said bath is discontinued for approximately 5 seconds while the article remains immersed therein, and whereupon the article is removed gradually from said bath. Preferably, said bath is agitated in a pulsating manner. Preferably, the article is drained for approximately from 30 to 40 seconds before the article is dipped in the bath of similar composition.

Alternatively, the bath wherein the article is immersed initially is agitated while the article is immersed therein for approximately from 20 to 30 seconds, whereupon the article is drained, and whereupon the article is sprayed with the powder so as to contact the article with the powder. Hence, the bath for separate steps of the process either may be separate baths or one bath, separate baths being preferred. Preferably, the article is drained for approximately from 30 to 40 seconds before the article is sprayed with the powder.

The resin may be selected from the group consisting of epoxy resins, phenylene oxide-based resins, polyacrylics including acrylonitrile-butadiene-styrene copolymers, polyaryl ethers, polypropylene, polystyrene, and polysulfones. Accordingly, the process produces a uniform, adherent deposit of the metal on the article. The resulting deposit is anchored firmly to the article and may be buffed on a soft wheel, so as to produce a bright, smooth surface.

Additionally, the process may comprise further steps of immersing the article for approximately 15 seconds in an aqueous solution of nitric acid in an amount of approximately 10% by volume, rinsing the article in water, and immersing the article for approximately 15 minutes in an aqueous solution of nickel sulfate in an amount approximately from 50 to 60 grams per liter, ammonium sulfate in an amount approximately from 50 to 60 grams per liter, and sodium thiosulfate in an amount of approximately from 100 to 120 grams per liter, at a temperature of approximately from 20° to 30° C.

Accordingly, the process produces an overlying strike of nickel of sufficient thickness and electrical conductivity to be electroplated in conventional electroplating baths, as by bright nickel followed by decorative chromium. The overlying strike tends to bridge minute areas that are not completely filled by the metal of the underlying deposit.

Advantageously, as compared with conventional processes, the process of this invention is simple, fast, inexpensive, and effective for plating on a variety of plastics, the process does not require chromic acid, either with or without sulfuric acid, and the process does not require initial deposition of a metal by catalytic reaction. Hence, costs of chemicals are lowered, and problems of pollution are lessened in severity, as trichloroethylene evaporates slowly, and as no metal needs to be discharged. Chemical analyses of the baths containing trichloroethylene are not required, for trichloroethylene, ethanol, and methylene chloride essentially are mutually immiscible. Hence, relative proportions of trichloroethylene, ethanol, and methylene chloride, as well as metal powder if included in a given bath, can be estimated from samples drawn from an agitated bath and allowed to settle in a graduated cylinder. Either ethanol or methylene chloride can be added as needed. Metal powder can be added as needed. Special equipment is not needed.

Although interior areas of hollow articles may not be platable by the process of this invention, and although normal precautions including coverage of the baths after the articles have been lowered therein on racks, on trays, or otherwise, must be pursued, the process of this invention presents few disadvantages, as compared with conventional processes.

DETAILED DESCRIPTION OF PREFERRED MODES

Pursuant to this invention, a metal, which may be copper, nickel, or another metal suitable for plating on plastics, can be plated on articles, which have been molded or fabricated otherwise from any of various resins. Copper is preferred. The resin may be any resin susceptible to softening (swelling) upon contact with trichloroethylene or with trichloroethylene and methylene chloride. It has been demonstrated that acrylonitrile-butadiene-styrene copolymers, polyaryl ethers, polycarbonates, polyethylene, and polystyrene are susceptible to softening (swelling) upon contact with trichloroethylene and that methylene chloride does not affect softening (swelling) of these resins. It is contemplated that other resins including polyacrylics besides acrylonitrile-butadiene-styrene copolymers, phenylene oxide-based resins, and polysulfones are susceptible to softening (swelling) upon contact with trichloroethylene or with trichloroethylene and methylene chloride. Herein, acrylonitrile-butadiene-styrene copolymers are considered to be polyacrylics.

Although epoxy resins and polypropylene have been found not to be susceptible to softening (swelling) upon contact with trichloroethylene, it has been found that epoxy resins and certain grades of polypropylene are susceptible to softening (swelling) upon contact with a combination of trichloroethylene and methylene chloride. Although softening (swelling) of resins upon contact with trichloroethylene or a combination of trichloroethylene and methylene chloride has been found to proceed rapidly for commercial use in plating, it also has been found that ethanol moderates softening (swelling) of resins upon contact with trichloroethylene or with trichloroethylene and methylene chloride. Preferred proportions are 90 parts of trichloroethylene, 9 to 10 parts of ethanol, and 0 to 1 part of methylene chloride. These constituents essentially are immiscible in each other but can be agitated as required. As commercial grades of these constituents may be used, insignificant amounts of water may be tolerated, as such amounts of water may be introduced with ethanol of commercial grade.

Accordingly, preferred practice of this invention requires a first bath and a second bath, each bath consisting essentially of 90 parts of trichloroethylene by volume, 9 to 10 parts of ethanol by volume, and 0 to 1 part of methylene chloride by volume, and each bath contains 1 part of methylene chloride by volume if any articles fabricated from epoxy resins or polypropylene are to be plated. If no articles fabricated from epoxy resins or polypropylene are to be plated, methylene chloride may be omitted, whereupon 10 parts of ethanol are used. The first bath and the second bath are maintained at respective temperatures of approximately from 20° to 30° C. Room temperature thus is appropriate.

Preferably, copper powder of particle sizes of approximately from 50 to 150 microns is added to the first bath, in an amount of approximately from 200 to 250 grams per liter. Provision is made for the first bath wherein copper powder has been added to be agitated in a pulsating manner, as by a magnetic stirrer, so as to allow cyclic use of the first bath. Preferably, the first bath is agitated for approximately from 15 to 25 seconds, whereupon agitation of the first bath is discontinued for approximately 5 seconds, and these steps are repeated cyclically.

Preliminarily, the articles to be plated are racked, dipped into an alkaline detergent, and rinsed in water. Ordinary kitchen detergent may be used.

Subsequently, the articles are immersed in the first bath wherein copper powder has been added, and the first bath is agitated for approximately from 15 to 25 seconds after the article has been immersed in the first bath, whereupon agitation of the first bath is discontinued for approximately 5 seconds while the article remains immersed in the first bath, whereupon the article is removed gradually from the first bath, and whereupon the article is drained for approximately from 30 to 40 seconds.

After the articles have been drained for approximately from 30 to 40 seconds, the articles are dipped into the second bath, which does not contain copper powder, whereupon the articles are removed quickly so that any copper not adhering to the articles comes off, and so that the copper deposit is rendered even.

Alternatively, copper powder is not added to the first bath, in which the articles that have been racked, dipped into the alkaline detergent, and rinsed in water, are immersed for approximately from 20 to 30 seconds, whereupon the articles are drained for approximately 30 to 40 seconds, and whereupon copper powder of particle sizes of approximately from 50 to 150 microns is sprayed onto the articles. Copper powder may be sprayed onto the articles by any suitable means, some of which are disclosed in H. Narcus, op. cit.

After copper powder has been sprayed onto the articles, the articles are dipped into the second bath, which does not contain copper powder, whereupon the articles are removed quickly so that any copper not adhering to the articles comes off, and so that the copper deposit is rendered even.

If copper powder is sprayed onto the articles, the first bath and the second bath may be a common bath, which is used twice. However, it is preferred for the first bath and the second bath to be separate, whereby a linear progression of the articles through the process of this invention may be accommodated.

After the articles have been removed from the second bath, the articles are dried for approximately 60 seconds, in a current of air at a temperature of approximately 25° to 40° C.

Accordingly, the articles are provided with a uniform adherent deposit of copper, which may be buffed on a soft wheel so as to produce a bright, smooth finish.

Preferably, an overlying strike of nickel is plated non-catalytically on the underlying deposit of copper. The articles to be plated with an overlying strike of nickel are immersed for approximately 15 seconds in an aqueous solution of nitric acid in an amount of approximately 10% by volume, whereupon the articles are rinsed in water, and whereupon the articles are immersed for approximately 15 minutes in a third bath.

The third bath is an aqueous solution of nickel sulfate in an amount of approximately from 50 to 60 grams per liter, ammonium sulfate in an amount of approximately 50 to 60 grams per liter, and sodium thiosulfate in an amount of approximately from 100 to 200 grams per liter, and is maintained at a temperature of approximately from 20° to 30° C. Room temperature thus is appropriate. A similar bath containing nickel ammonium sulfate, not ammonium sulfate, is given in N. Hall, "Immersion Plating," *Metal Finishing*, 48th Guidebook-Directory Issue 1980, at page 478.

Accordingly, an overlying strike of nickel of sufficient thickness and electrical conductivity to be electroplated in conventional baths, as by bright nickel followed by decorative chromium, is plated on the underlying deposit. The overlying strike tends to bridge minute areas that are not completely filled by the copper of the underlying deposit.

Simple screening tests can be made so as to determine whether a resin is platable by a process according to this invention. A first sample of the resin is immersed in a bath containing trichloroethylene. If softening of the first sample is perceptible within a few seconds, the resin is platable by a process according to this invention. If softening of the first sample is not perceptible within a few seconds, a second sample of the resin is immersed in a bath being agitated as the second sample is immersed therein and containing approximately 90 parts of trichloroethylene and 1 part of methylene chloride. If softening of the second sample is perceptible within a few seconds, the resin is platable by a process according to this invention.

As is known, trichloroethylene evaporates at a slow rate, ethanol evaporates at a fast rate, and methylene chloride evaporates at an intermediate rate. Chemical analyses of the baths containing trichloroethylene are not required, for trichloroethylene, ethanol, and methylene chloride essentially are mutually immiscible. Hence, relative proportions of trichloroethylene, ethanol, and methylene chloride, as well as metal powder if included in a given bath, can be estimated from samples drawn from an agitated bath and allowed to settle in a graduated cylinder.

Appearance of the plated metal and adhesion of the plated metal to the resin substrate are satisfactory for many industrial purposes.

I claim:

1. A process for plating a metal on an article fabricated from a resin susceptible to softening of the resin upon contact of the resin with trichloroethylene or with trichloroethylene and methylene chloride, said process comprising the steps of
   (a) immersing the article in a bath being agitated as the article is immersed therein and consisting essentially of
      (1) approximately 90 parts of trichloroethylene by volume,
      (2) approximately from 9 to 10 parts of ethanol by volume, and
      (3) approximately from 0 to 1 part of methylene chloride by volume, wherein the bath contains approximately 1 part of methylene chloride if the resin is polypropylene,
   (b) contacting the article with the metal as a powder of particle sizes of approximately from 50 to 150 microns, and
   (c) dipping the article in a bath being agitated as the article is dipped therein and consisting essentially of trichloroethylene, ethanol, and methylene chloride in proportions used in the bath for step (a).

2. The process of claim 1 wherein the powder has been added, in an amount of approximately from 200 to 250 grams per liter of the bath, to the bath for step (a) and wherein the bath for step (a) is agitated for approximately 15 to 25 seconds after the article has been immersed therein, whereupon agitation of the bath for step (a) is discontinued for approximately 5 seconds while the article remains immersed therein, and whereupon the article is removed gradually from the bath for step (a).

3. The process of claim 2 wherein the bath for step (a) is agitated in a pulsating manner.

4. The process of claim 2 wherein the article is drained for approximately from 30 to 40 seconds between steps (b) and (c).

5. The process of claim 2 wherein the article is dried in a current of air at a temperature of approximately from 20° to 40° C. for approximately 60 seconds after step (c).

6. The process of claim 2 comprising prior steps of dipping the article into an alkaline cleaner and rinsing the article in water.

7. The process of claim 2 wherein each bath is maintained at a temperature of approximately from 20° to 30° C.

8. The process of claim 2 wherein the metal is copper or nickel.

9. The process of any of claims 1 through 8 wherein the resin is selected from the group consisting of epoxy resins, phenylene oxide-based resins, polyacrylics including acrylonitrile-butadiene-styrene copolymers, polyaryl ethers, polypropylene, polystyrene, and polysulfones.

10. The process of claim 9 comprising later steps of (d) immersing the article for approximately 15 seconds in an aqueous solution of nitric acid in an amount of approximately 10% by volume, (e) rinsing the article in water, and (f) immersing the article for approximately 15 minutes in an aqueous solution of
   (1) nickel sulfate in an amount of approximately from 50 to 60 grams per liter,
   (2) ammonium sulfate in an amount of approximately from 50 to 60 grams per liter, and
   (3) sodium thiosulfate in an amount of approximately from 100 to 120 grams per liter, at a temperature of approximately 20° to 30° C.

11. The process of claim 1 wherein the bath for step (a) is agitated while the article is immersed therein for approximately from 20 to 30 seconds, whereupon the article is drained, and whereupon the article is sprayed with the powder so as to contact the article with the powder.

12. The process of claim 11 wherein the bath for step (a) and the bath for step (c) are separate baths.

13. The process of claim 11 wherein the bath for step (a) and the bath for step (c) are one bath.

14. The process of claim 11 wherein the article is drained for approximately from 30 to 40 seconds before the article is sprayed with the powder.

15. The process of claim 11 wherein the article is dried in a current of air at a temperature of approximately from 20° to 40° C. for approximately 60 seconds after step (c).

16. The process of claim 11 comprising prior steps of dipping the article into an alkaline cleaner and rinsing the article in water.

17. The process of claim 11 wherein each bath is maintained at a temperature of approximately from 20° to 30° C.

18. The process of claim 11 wherein the metal is copper or nickel.

19. The process of any of claims 11 through 18 wherein the resin is selected from the group consisting of epoxy resins, phenylene oxide-based resins, polyacrylics including acrylonitrile-butadiene-styrene copolymers, polyaryl ethers, polypropylene, polystyrene, and polysulfones.

20. The process of claim 19 comprising later steps of
   (d) immersing the article for approximately 15 seconds in an aqueous solution of nitric acid in an amount of approximately 10% by volume,
   (e) rinsing the article in water, and
   (f) immersing the article for approximately 15 minutes in an aqueous solution of
      (1) nickel sulfate in an amount of approximately from 50 to 60 grams per liter,
      (2) ammonium sulfate in an amount of approximately from 50 to 60 grams per liter, and
      (3) sodium thiosulfate in an amount of approximately from 100 to 120 grams per liter, at a temperature of approximately 20° to 30° C.

* * * * *